(12) United States Patent
Schrödinger et al.

(10) Patent No.: US 6,642,790 B2
(45) Date of Patent: Nov. 4, 2003

(54) DIFFERENTIAL, COMPLEMENTARY AMPLIFIER

(75) Inventors: Karl Schrödinger, Berlin (DE); Jaro Stimma, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/122,628

(22) Filed: Apr. 15, 2002

(65) Prior Publication Data

US 2002/0149427 A1 Oct. 17, 2002

Related U.S. Application Data

(63) Continuation of application No. PCT/DE01/03094, filed on Aug. 15, 2001.

(30) Foreign Application Priority Data

Aug. 15, 2000 (DE) .......................................... 100 42 170

(51) Int. Cl.$^7$ ................................................ H03F 3/45
(52) U.S. Cl. ..................... 330/253; 330/261; 330/263
(58) Field of Search ................................ 330/253, 261, 330/263, 264, 265

(56) References Cited

U.S. PATENT DOCUMENTS

| 3,991,380 A | 11/1976 | Pryor .......................... 330/253 |
| 4,937,476 A | 6/1990 | Bazes .......................... 326/71 |
| 4,958,133 A | 9/1990 | Bazes .......................... 330/253 |
| 5,206,602 A | 4/1993 | Baumgartner et al. ......... 330/9 |
| 5,939,942 A | * 8/1999 | Greason et al. ............. 330/253 |
| 5,990,743 A | * 11/1999 | Gabara ....................... 330/253 |
| 6,028,467 A | 2/2000 | Burrows et al. ............ 327/331 |

FOREIGN PATENT DOCUMENTS

| EP | 0 355 906 A1 | 2/1990 |
| FR | 2 667 744 A1 | 4/1992 |

OTHER PUBLICATIONS

Cordaro, W.: "Complementary FET Differential Amplifier", IBM Technical Disclosure Bulletin, vol. 16, No. 10, XP002185177, Mar. 1974, pp. 3227–3228.

* cited by examiner

*Primary Examiner*—Robert Pascal
*Assistant Examiner*—Khanh V. Nguyen
(74) *Attorney, Agent, or Firm*—Laurence A. Greenberg; Werner H. Stemer; Ralph E. Locher

(57) ABSTRACT

A differential amplifier has two amplifier paths. The second amplifier path is operated in the opposite direction relative to the first amplifier path. The outputs of the two amplifier paths form a differential output and are in each case connected to one another via a respective load resistor at a node. The operating point of the two amplifier paths is set by the voltage that is present at the node. The differential load is divided into two individual resistors and the voltage present between the individual resistors serves for setting the operating point of the amplifier paths. The bandwidth and the gain can be influenced by varying the resistances of the load resistors.

25 Claims, 4 Drawing Sheets

DIFFERENTIAL, COMPLEMENTARY AMPLIFIER

CROSS-REFERENCE TO RELATED APPLICATION

This application is a continuation of copending International Application No. PCT/DE01/03094, filed Aug. 15, 2001, which designated the United States.

BACKGROUND OF THE INVENTION

Field of the Invention

The invention relates to a differential, complementary amplifier having two complementary amplifier paths, each including a p-channel transistor and an n-channel transistor connected in series. Amplifiers of this type serve for amplifying differential analog or digital input signals. They have a wide range of application and are suitable, in particular, for amplifying high-frequency signals with data rates up to the Gbit/s range.

U.S. Pat. No. 4,937,476 discloses a differential amplifier having two amplifier paths that are arranged in parallel and that each have a pair of CMOS transistors. A third pair of CMOS transistors controls the current supply for the two amplifier paths and sets the operating point thereof. To that end, the output of the drain terminals—connected to one another—of the first amplifier path is connected to the gate terminals of the third CMS transistor pair. The known amplifier makes an output voltage available at the output of the second amplifier path for a differential voltage present at the gate terminals of the two amplifier paths.

U.S. Pat. No. 4,958,133 describes a differential, complementary amplifier having CMOS amplifier paths arranged in parallel. An improved negative feedback is described that provides a high degree of common-mode rejection and a high voltage gain for differential signals.

In the differential amplifiers disclosed in the two documents mentioned, one path of the amplifier always functions solely to stabilize the operating-point and the other path of the amplifier serves as the actual amplifier. As a result, the gain is limited in the case of a relatively large current consumption. Moreover, the abovementioned amplifier circuits in each case have only a "single ended" output. This prevents the use of a simple series circuit with a second differential amplifier stage.

A further differential, complementary amplifier having two amplifier paths is described in U.S. Pat. No. 6,028,467.

SUMMARY OF THE INVENTION

It is accordingly an object of the invention to provide a differential, complementary amplifier which overcomes the above-mentioned disadvantages of the prior art apparatus of this general type.

In particular, it is an object of the invention to provide a differential, complementary amplifier that provides a relatively high gain in conjunction with high bandwidth and low current consumption and that also enables a simple interconnection of a plurality of amplifier stages.

With the foregoing and other objects in view there is provided, in accordance with the invention, a differential, complementary amplifier including: a first complementary MOSFET amplifier path including a p-channel transistor and an n-channel transistor connected in series; a second complementary MOSFET amplifier path including a p-channel transistor and an n-channel transistor connected in series; a first load resistor and a second load resistor; and a node. The second amplifier path is operated in an opposite direction relative to the first amplifier path. The output of the first amplifier path and the output of the second amplifier path form a differential output. The first load resistor connects the output of the first amplifier path to the node. The second load resistor connects the output of the second amplifier path to the node. The operating point of the first amplifier path and the second amplifier path is set by a voltage present at the node.

In accordance with an added feature of the invention, the first amplifier path and the second amplifier path are driven by half of the operating voltage.

In accordance with an additional feature of the invention, the first amplifier path and the second amplifier path have a bandwidth that is variable by varying the first load resistor and the second load resistor.

In accordance with another feature of the invention, there is provided, at least a first FET control transistor and a second FET control transistor for controlling a current supplied to the first amplifier path and to the second amplifier path. The first FET control transistor has a gate terminal connected to the node. The second FET control transistor has a gate terminal connected to the node. The operating point of the first amplifier path and the second amplifier path is set by setting a voltage on the gate of the first FET control transistor and a voltage on the gate of the second FET control transistor.

In accordance with another added feature of the invention, the first FET control transistor is a p-channel control transistor; the second FET control transistor is an n-channel control transistor; and the first FET control transistor and the second FET control transistor are connected in series and form a complementary MOSFET transistor pair.

In accordance with another additional feature of the invention, there is provided, a terminal for receiving an operating voltage; and a ground terminal. The p-channel control transistor has a source terminal connected to the terminal for receiving the operating voltage. The n-channel control transistor has a source terminal connected to the ground terminal. The p-channel control transistor has a drain terminal. The n-channel control transistor has a drain terminal. The first amplifier path and the second amplifier path are configured between the drain terminal of the p-channel control transistor and the drain terminal of the n-channel control transistor.

In accordance with a further feature of the invention, the p-channel transistor of the first amplifier path has a source terminal; the p-channel transistor of the second amplifier path has a source terminal; the n-channel transistor of the first amplifier path has a source terminal; the n-channel transistor of the second amplifier path has a source terminal; the drain terminal of the p-channel control transistor is connected to the source terminal of the p-channel transistor of the first amplifier path and to the source terminal of the p-channel transistor of the second amplifier path; and the drain terminal of the n-channel control transistor is connected to the source terminal of the n-channel transistor of the first amplifier path and to the source terminal of the n-channel transistor of the second amplifier path.

In accordance with a further added feature of the invention, the first FET control transistor and the second FET control transistor are operated in a triode region.

In accordance with a further additional feature of the invention, the p-channel transistor of the first amplifier path and the p-channel transistor of the second amplifier path are identically constructed; and the n-channel transistor of the first amplifier path and the n-channel transistor of the second amplifier path are identically constructed.

In accordance with yet an added feature of the invention, there is provided a capacitor coupled to the node.

In accordance with yet an additional feature of the invention, there is provided, at least a first FET control transistor and a second FET control transistor for controlling a current supplied to the first amplifier path and to the second amplifier path. The first FET control transistor has a gate terminal, and the second FET control transistor has a gate terminal. A first low-pass filter connects the node to the gate terminal of the first control transistor, and a second low-pass filter connects the node to the gate terminal of the second control transistor.

In accordance with yet another feature of the invention, there is provided, at least a first FET control transistor and a second FET control transistor for controlling a current supplied to the first amplifier path and to the second amplifier path; a first current mirror circuit including a MOSFET transistor having an input connected to the node; and a second current mirror circuit including a MOSFET transistor having an input connected to the node. The first control transistor has a source terminal, and the second control transistor has a source terminal. The MOSFET transistor of the first current mirror circuit has an output connected to the source terminal of the first control transistor. The MOSFET transistor of the second current mirror circuit has an output connected to the source terminal of the second control transistor. The first current mirror circuit is assigned to the first control transistor. The second current mirror circuit is assigned to the second control transistor.

In accordance with an added feature of the invention, the first control transistor and the second control transistor are operated in a pinch-off region.

In accordance with an additional feature of the invention, there is provided, a negative feedback device for the first amplifier path and for the second amplifier path.

In accordance with another feature of the invention, the first amplifier path has source terminals; the second amplifier path has source terminals; the negative feedback device includes a first resistor connected to one of the source terminals of the first amplifier path and to one of the source terminals of the second amplifier path; and the negative feedback device includes a second resistor connected to another one of the source terminals of the first amplifier path and to another one of the source terminals of the second amplifier path.

In accordance with a further feature of the invention, there is provided, a terminal for receiving an operating voltage; a ground terminal; and two control transistors of identical size having gate terminals connected to the node and source terminals connected to the terminal for receiving the operating voltage, each one of the two control transistors having a drain terminal connected to a respective one of the first amplifier path and the second amplifier path. Two further control transistors of identical size have gate terminals connected to the node and source terminals connected to the ground terminal. Each one of the two further control transistors have a drain terminal connected to a respective one of the first amplifier path and the second amplifier path. One of the control transistors and one of the further control transistors are associated with the first amplifier path. Another one of the control transistors and another one of the further control transistors are associated with the second amplifier path. The first amplifier path and the second amplifier path define two paths. At least one resistor connects the first amplifier path to the second amplifier path at a location between the two control transistors and the two paths. At least one further resistor connects the first amplifier path to the second amplifier path at a location between the two further control transistors and the two paths.

In accordance with a further added feature of the invention, there is provided, a capacitor connected in parallel with the first resistor of the feedback device; and a capacitor connected in parallel with the second resistor of the feedback device.

In accordance with a further additional feature of the invention, the first amplifier path and the second amplifier path are configured for amplifying high-frequency signals.

In other words, in a differential amplifier having two amplifier paths, the second amplifier path is operated in the opposite direction relative to the first amplifier path. Outputs of the two amplifier paths form a differential output and are in each case connected to one another via a load resistor at a node. The operating point of the two amplifier paths is set by the voltage present at that node. According to the invention, the differential load is in this case divided into two individual resistors and the voltage present between the individual resistors serves for setting the operating point of the amplifier paths. The bandwidth and the gain can be influenced by varying the resistances of the load resistors.

Because of the fact that the amplifier paths operate relative to one another, voltage differences present at the respective amplifier paths are amplified with a doubled amplitude. Accordingly, a high gain is manifested. Setting the operating point of the two amplifier paths by way of the voltage present at the node between the two load resistors of the amplifier paths enables an accurate setting of the operating point since the voltage at the node has almost no AC components. On account of the symmetrical circuit dimensioning, a voltage amounting to half of the operating voltage (Vdd/2) is established in this case. Furthermore, the operating-point setting is "self-biased" because of the feedback that takes place.

According to the invention, the amplifier is provided with a differential output, i.e. the difference between the voltages at the output nodes of the amplifier can be made available to further amplifier stages. This enables a simple interconnection of a plurality of amplifier stages.

In the amplifier, both amplifier paths provide amplification and a signal for operating-point stabilization is derived from both paths, with the result that a fully differential, highly symmetrical amplifier circuit is present. As a result, with a smaller current consumption, a significantly higher gain than in the case of known differential amplifiers is obtained. In addition, it is possible to provide a very small supply voltage of less than 2 volts, as is required in modern CMOS technologies with feature sizes of less than 0.2 micrometer.

In a preferred refinement of the invention, the amplifier paths are driven by half of the operating voltage or supply voltage i.e., the operating point of the transistors of the amplifier paths is put at half of the operating voltage. In this drive range, the slope of the transfer characteristic of a complementary MOSFET is maximal and a correspondingly high gain is made available. A further advantage that results is that a plurality of differential amplifiers can be connected in series in a simple manner.

However, an asymmetrical design also lies within the scope of the invention, in which case, the driving is effected by a voltage shifted from half of the operating voltage. The transistors must then be dimensioned accordingly.

Preferably, the operating point of the two amplifier paths is set by setting the gate voltage of at least two FET control transistors that control the current supply for the two amplifier paths. The gate terminal of the FET control transistors in each case are coupled to the node between the two load resistors. In particular, the FET control transistors are a CMOS pair with a p-channel control transistor and an n-channel control transistor.

The voltage at the node between the load resistors controls the gate voltage, and therefore the current supply for the CMOS control transistors. The operating point for the first and second amplifier paths is set by way of the current supply. In this case, the control transistors for the amplifier paths act as operating-point-stabilizing resistors.

In a preferred design of the invention, the source terminal of the p-channel control transistor is connected to the operating voltage and the source terminal of the n-channel control transistor is connected to ground and the first and second amplifier paths are arranged between the drain terminals of the two control transistors. For this purpose, the drain terminal of the p-channel control transistor is connected to the source terminal of the p-channel transistor of the first amplifier path and to the source terminal of the p-channel transistor of the second amplifier path, and the drain terminal of the n-channel control transistor is connected to the source terminal of the n-channel transistor of the first amplifier path and to the source terminal of the n-channel transistor of the second amplifier path. The respective p-channel and n-channel transistors have corresponding operating parameters, with the result that a fully symmetrical circuit is present.

The FET control transistors are preferably operated in the triode region. In this case, they act as resistors having a linear behavior. As a result, the feeding of current into the amplifier paths can be set by way of the operating voltage.

In an advantageous development of the invention, the node between the two load resistors of the amplifier paths that operate relative to one another is coupled to a capacitor. This has the advantage that any asymmetries at the node which might influence the control transistors are filtered out.

In a further development of the invention, the node between the two load resistors is connected via a respective low-pass filter to the gate terminals of the control transistors. As a result, any asymmetries at the node are likewise filtered out, so that no AC signals are present at the control transistors.

In a preferred refinement of the amplifier, the control transistors are in each case assigned a current mirror circuit with a MOSFET transistor having an input that is likewise connected to the node between the two load resistors. As a result, the control transistors can be operated in saturation. As a consequence, the amplifier paths acquire a greater resistance and the gain increases.

The first and second amplifier paths advantageously have additional a negative feedback device which stabilizes the circuit. The negative feedback device preferably has resistors, which are in each case connected to the source terminals of the first and second amplifier paths. By using the resistors, it is possible to widen the bandwidth of the amplifier (at the expense of the gain), i.e. a gain decrease commences only at higher frequencies.

The resistors are advantageously arranged such that the control transistors are, in each case, divided into two transistors of identical size having gate terminals connected to the node between the load resistors, source terminals connected to the operating voltage and ground, respectively, and drain terminals connected to one of the two amplifier paths. Two parallel paths of amplifier paths and control transistors are produced. The two paths are connected to one another (between an amplifier path and a control transistor) in each case by at least one resistor.

In this case, advantageously, a respective capacitor is connected in parallel with the resistors. By additionally increasing the high-frequency signal components, the resulting RC elements accelerate the rise edges of a digital signal to be amplified (so-called "peaking").

Other features which are considered as characteristic for the invention are set forth in the appended claims.

Although the invention is illustrated and described herein as embodied in a differential, complementary amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
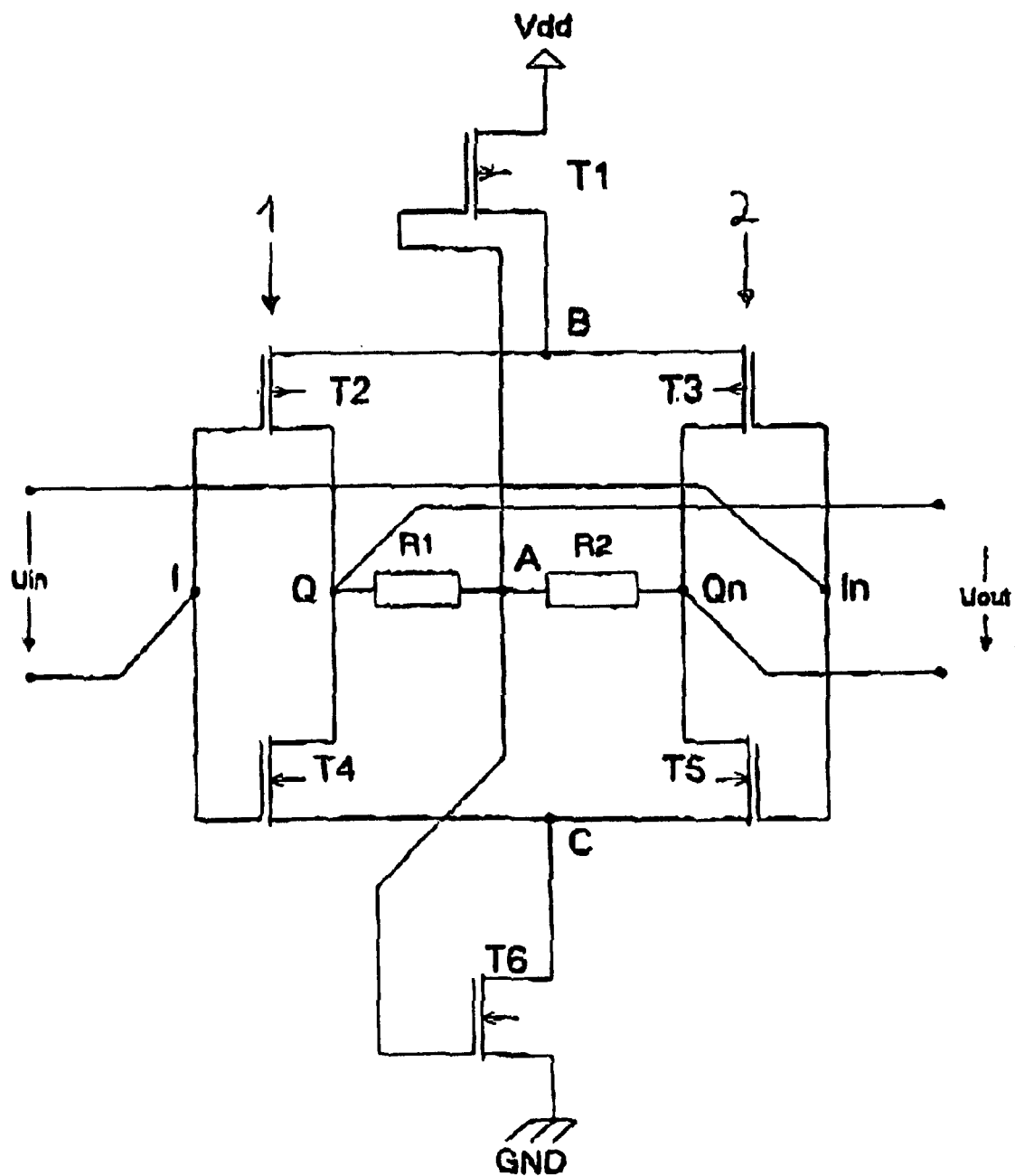
FIG. 1 shows a differential amplifier.

Referring now to the figures of the drawing in detail and first, particularly, to FIG. 1 thereof, there is shown a basic circuit of an inventive differential amplifier. It has three CMOS p-channel transistors T1, T2, T3, three CMOS n-channel transistors T4, T5, T6 and two load resistors R1, R2. The transistors T2 and T3 and also T4 and T5 are in each case of the same size and form two CMOS inverters 1, 2 with complementary, series-connected transistors T2, T4 and T3, T5.

The two CMOS inverters 1, 2 represent two differential amplifier paths which operate relative to one another and are arranged between two drain loads B, C of the CMOS transistors T1, T6. The CMOS transistors T1, T6 represent control transistors for controlling the current flow through the amplifier stages 1, 2 and for setting the operating point of the transistors T2, T4, T3, T5. In this case, the source terminals of the p-channel transistors T2, T3 are connected to the drain terminal of the p-channel transistor T1 and the source terminals of the n-channel transistors T4, T5 are connected to the drain terminal of the n-channel transistor T6. The source terminal of the transistor T1 is connected to the operating voltage Vdd and the source terminal of the transistor T6 is connected to ground.

The load resistor R1 is arranged at the common, fixedly coupled drain terminal Q of the transistors T2, T4, and the load resistor R2 is arranged at the common, fixedly coupled drain terminal Qn of the transistors T3, T5. The load resistors R1, R2 form the differential load and can be dimensioned in accordance with the required bandwidth.

The outputs Q, Qn of the two amplifier paths 1, 2 are fixedly connected to one another via the load resistors R1, R2 at a node A. The node A is in turn connected to the gate terminals of the two CMOS transistors T1, T6 and thus controls the current supply for the transistors T1, T6. As a result, operating-point stabilization is obtained for the transistors T2, T4, T3, T5 (self-biasing).

A differential input voltage Uin is applied via the input nodes (I and In) to the gate terminals of the transistors T2, T4 and T3, T5 of the two amplifier paths 1, 2. An output voltage Uout is tapped off at the nodes Q, Qn of the drain terminals of the two amplifier paths. In this case, the index "n" (n=negated) denotes the respectively inverted nodes or signals.

In this case, both amplifier paths 1, 2 operate relative to one another, so that a change in the input voltage leads for example both to a voltage increase at the reference point Q and to a voltage decrease at the reference point Qn. Consequently, a high gain with a "doubled amplitude" takes place.

The operating point of the transistors T2, T4 and T3, T5 is set by the voltage present at the center tap A, between the load resistors, by the CMOS transistor pair T1, T6 that controls the drain current through the transistors T2, T4 and T3, T5. In the exemplary embodiment of FIG. 1, the CMOS transistors T1, T6 are operated in the triode region, so that they represent a resistor in the source line of the transistors T2, T4 and T3, T5.

A voltage having almost no AC component is present at the connecting node A between the two load resistors R1, R2. This results from the symmetry of the circuit. In this case, a signal for operating-point stabilization is derived from both amplifier paths 1, 2.

The amplifier circuit is driven by the mid-voltage Vdd/2, so that the inverters 1, 2 are driven at the optimum operating point and have a high, linear gain. Thus, the maximum gain of a CMOS inverter is present precisely in the case of driving with half the operating voltage. The resistors R1 and R2 are preferably chosen to be identical, with the result that a completely symmetrical circuit is present.

Driving at the mid-voltage Vdd/2 also has the advantage that a plurality of amplifier stages can be connected in series in a simple manner.

Figure 2:
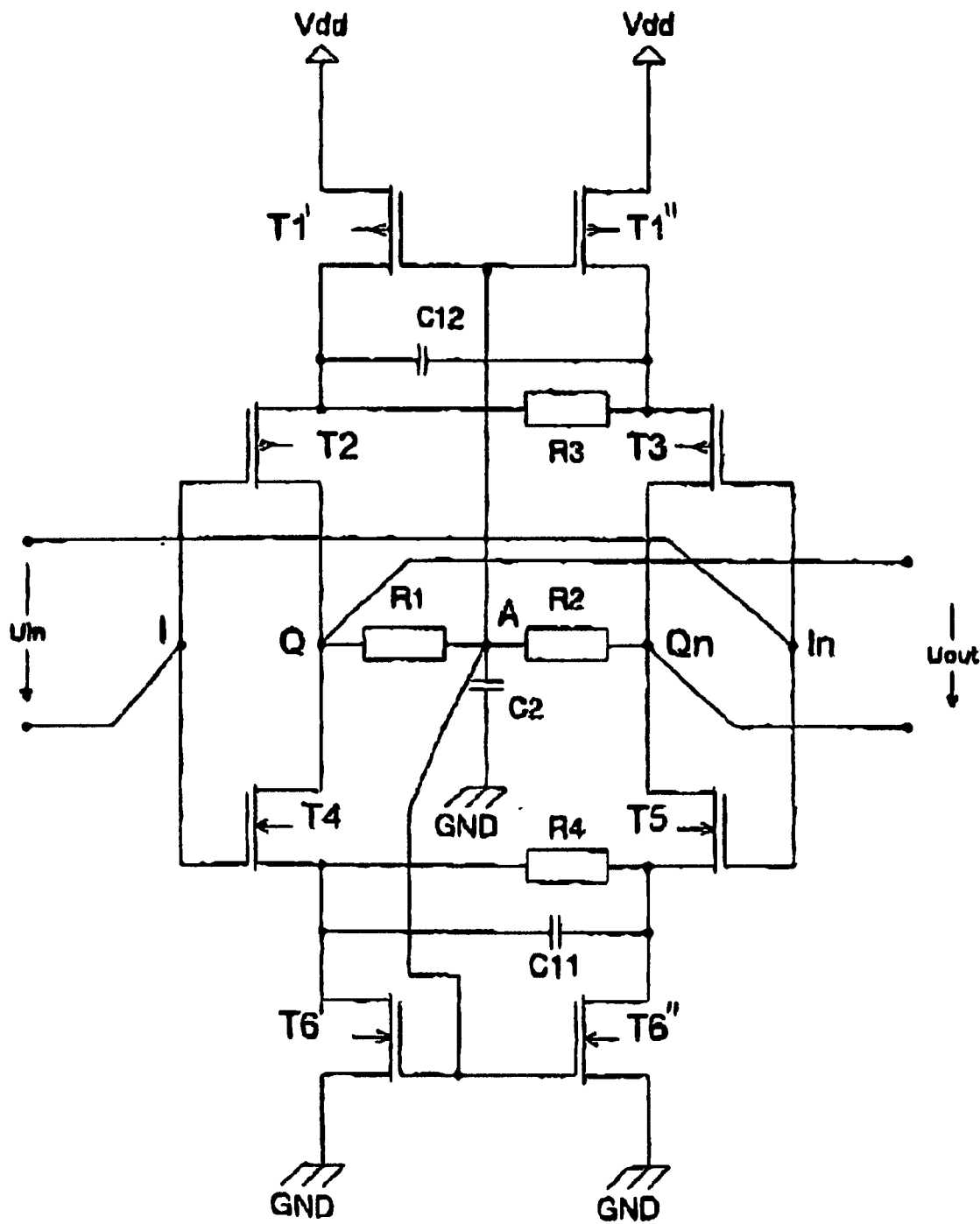
FIG. 2 shows a first development of the amplifier shown in FIG. 1.

FIG. 2 illustrates a first development of the circuit shown in FIG. 1, which additionally has negative feedback in the form of resistors R3, R4 which are each connected in parallel with a respective one of the capacitors C11, C12. The transistors T1 and T2 of FIG. 1 are in each case divided into transistors T1', T1" and T6', T6" of half the size. The transistors T1', T1" and T6', T6" have gate terminals connected to node A, source terminals connected to the operating voltage Vdd and to ground, respectively, and drain terminals that are in each case connected to an amplifier path 1, 2. Parallel paths of the amplifier are formed between which the resistors R3, R4 and the capacitors C11, C12 are connected. Thus, by way of example, the resistor R3 is connected to the two source terminals of the transistors T2, T3.

The negative feedback with the resistors R3, R4 increases the bandwidth of the amplifier, but at the expense of the gain. The capacitors C11, C12 together with the resistors R3, R4 form RC elements, and by additionally increasing the high-frequency signal components, accelerate the edges of digital signals to be amplified (so-called "peaking"). This has the result that a sinusoidal input signal tends to acquire a square-wave form. This effect is manifested, in particular, in the case of a plurality of amplifier stages connected in series.

In addition, a capacitor C2 is provided in FIG. 2. The capacitor C2 is connected to the reference point A and to ground, and filters out any asymmetries in the differential amplifier, with the result that no AC signals are present at the control transistors T1', T1", T6', T6".

Figure 3:
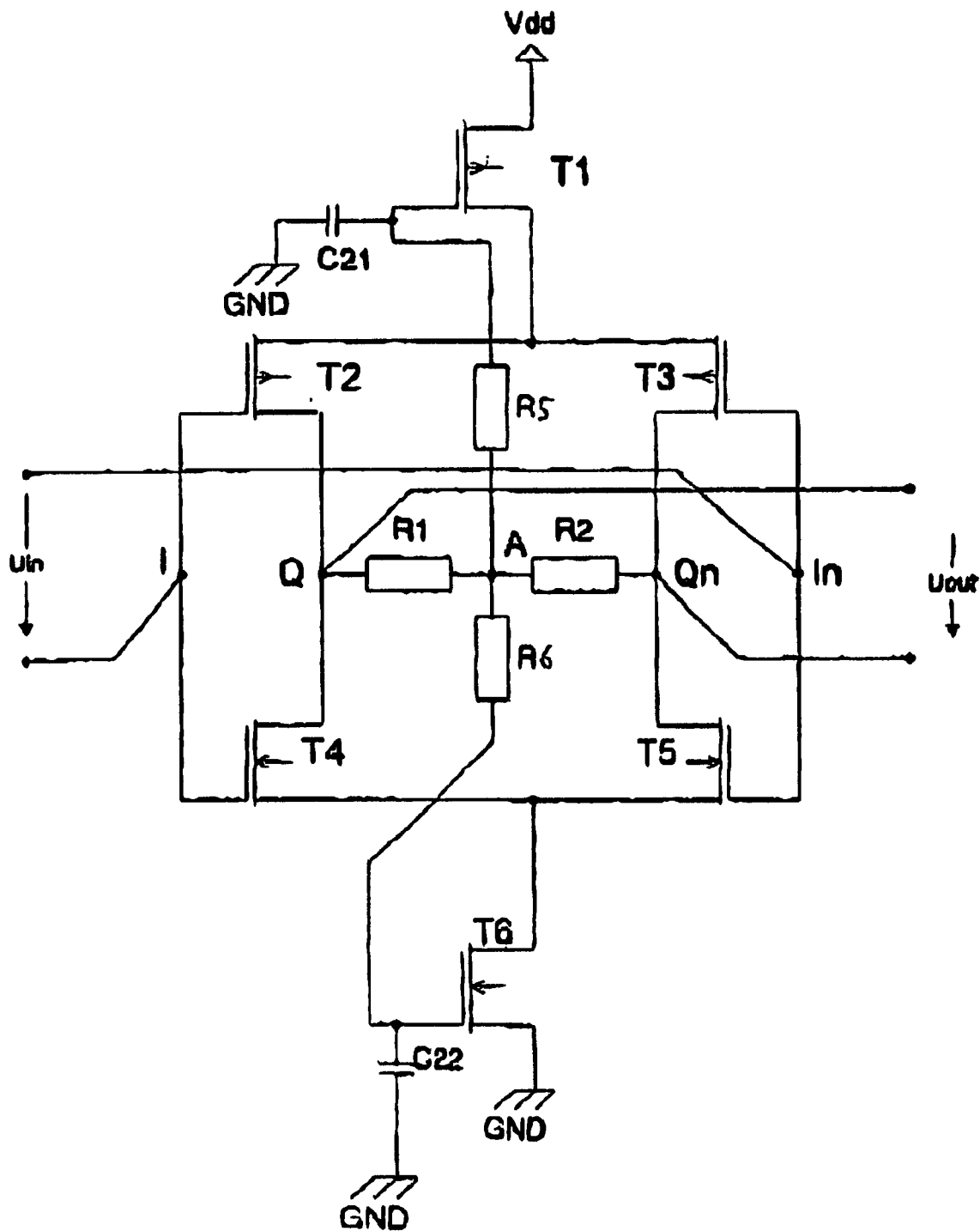
FIG. 3 shows a second development of the amplifier shown in FIG. 1.

In the exemplary embodiment shown in FIG. 3, a low-pass filter including resistors R5, R6 and capacitors C21, C22 is in each case arranged between the node A and the gate terminals of the control transistors T1, T6. The load resistors R1, R2 and the series connected resistors R5, R6 can be dimensioned independently in this case. Preferably, R1 is equal to R2 and R5 is equal to R6, in order to maintain the symmetry of the circuit. Similarly, the capacitors C21, C22 have the same capacitance.

The low-pass filters likewise serve for filtering any asymmetries at the differential amplifier or at the node A in order to ensure that no AC components are present at the gate terminals of the control transistors T1, T6.

Figure 4:
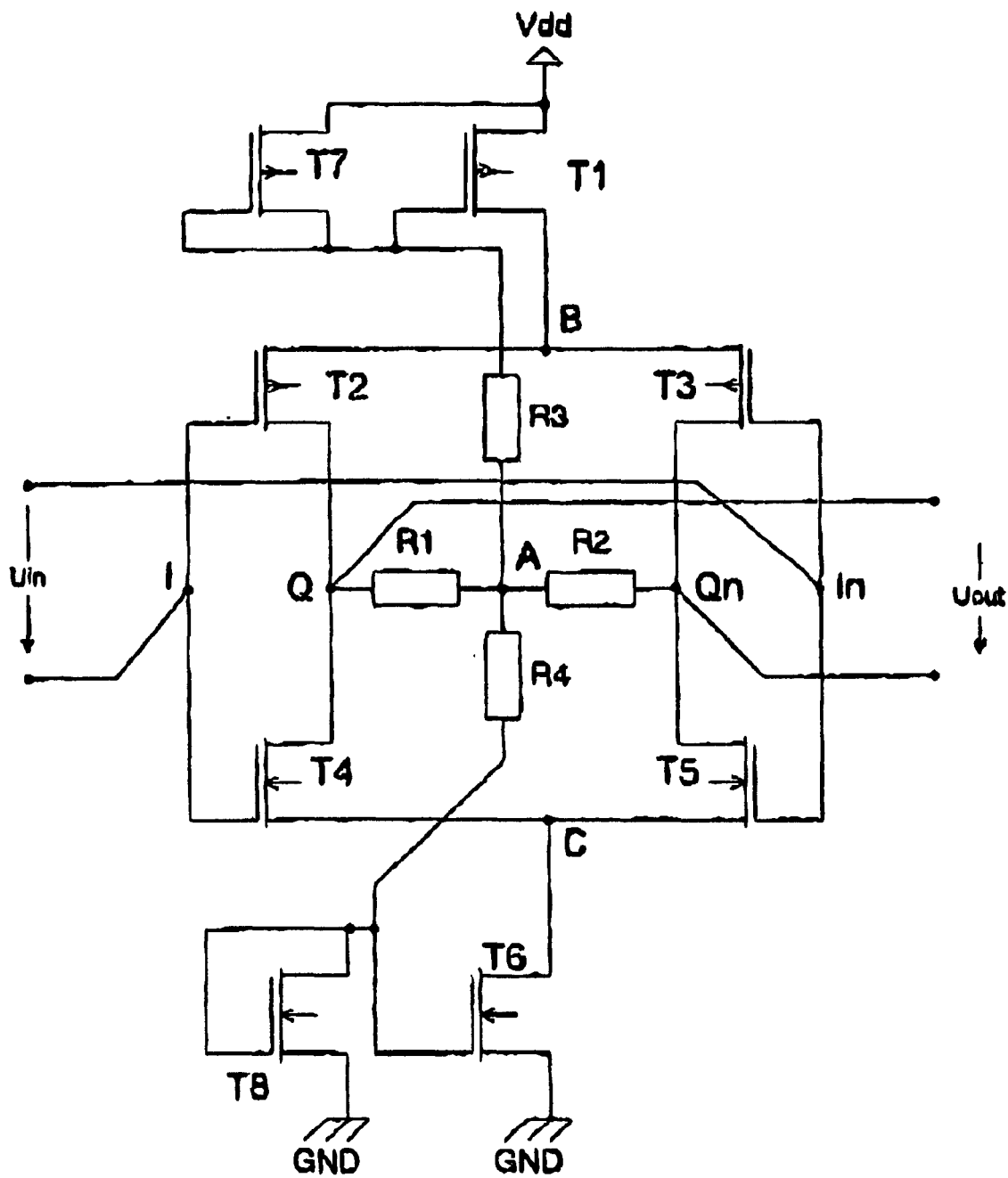
FIG. 4 shows a third development of the amplifier shown in FIG. 1.

In FIG. 4, the circuit shown in FIG. 1 is developed to the effect that the feedback via the node A is effected via current mirrors. To that end, the control transistors T1, T6 are in each case assigned a current mirror circuit with a MOSFET transistor T7, T8. In this case, one transistor T7 is a p-channel MOSFET whose input is connected to the node A and whose output is connected to the source terminal of the control transistor T1 or to the reference voltage. Correspondingly, the other transistor T8 is an n-channel MOSFET whose input is connected to the node A and whose output is connected to the source terminal of the control transistor T6 or to ground.

The transistors T7, T8 are operated in saturation, the current through the transistors T7, T8 being set by the node A. The current is mirrored to the control transistors T1, T6, which has the result that the control transistors T1, T6 are also operated in saturation, i.e. in the pinch-off region.

In the circuit of FIG. 4, the drain node B, C acquires greater resistance as a result of the control transistors T1, T6 being operated in saturation, with the result that the gain increases.

The embodiment of the invention is not restricted to the exemplary embodiments described above. All that is essential to the invention is that two amplifier paths are operated in opposite directions, that the outputs of the two amplifier paths form a differential output, and that the outputs of the two amplifier paths are connected to one another via a load resistor at a node. The operating point of the two amplifier paths is set by way of the voltage present at the node. The fully differential output enables a chain circuit of a plurality of such amplifier stages.

We claim:

1. A differential, complementary amplifier, comprising:
   a first complementary MOSFET amplifier path including a p-channel transistor and an n-channel transistor connected in series;
   a second complementary MOSFET amplifier path including a p-channel transistor and an n-channel transistor connected in series;
   a first load resistor and a second load resistor; and
   a node;
   said second amplifier path being operated in an opposite direction relative to said first amplifier path;
   said first amplifier path having an output;
   said second amplifier path having an output;
   said output of said first amplifier path and said output of said second amplifier path forming a differential output;

said first load resistor connecting said output of said first amplifier path to said node;

said second load resistor connecting said output of said second amplifier path to said node;

said first amplifier path and said second amplifier path having an operating point set by a voltage present at said node at least a first FET control transistor and a second FET control transistor for controlling a current supplied to said first amplifier path and to said second amplifier path, said first FET control transistor having a gate terminal, said second FET control transistor having a gate terminal;

a first low-pass filter connecting said node to said gate terminal of said first control transistor; and a second low-pass filter connecting said node to said gate terminal of said second control transistor.

2. The amplifier according to claim 1, wherein said first amplifier path and said second amplifier path are driven by half of an operating voltage.

3. The amplifier according to claim 1, wherein said first amplifier path and said second amplifier path have a bandwidth that is variable by varying said first load resistor and said second load resistor.

4. The amplifier according to claim 1, comprising:

at least a first FET control transistor and a second FET control transistor for controlling a current supplied to said first amplifier path and to said second amplifier path;

said first FET control transistor having a gate terminal connected to said node;

said second FET control transistor having a gate terminal connected to said node; and said operating point of said first amplifier path and said second amplifier path being set by setting a voltage on said gate terminal of said first FET control transistor and a voltage on said gate terminal of said second FET control transistor.

5. The amplifier according to claim 4, wherein:

said first FET control transistor is a p-channel control transistor;

said second FET control transistor is an n-channel control transistor; and said first FET control transistor and said second FET control transistor are connected in series and form a complementary MOSFET transistor pair.

6. The amplifier according to claim 5, comprising:

a terminal for receiving an operating voltage; and a ground terminal;

said p-channel control transistor having a source terminal connected to said terminal for receiving the operating voltage;

said n-channel control transistor having a source terminal connected to said ground terminal;

said p-channel control transistor having a drain terminal;

said n-channel control transistor having a drain terminal; and said first amplifier path and said second amplifier path being configured between said drain terminal of said p-channel control transistor and said drain terminal of said n-channel control transistor.

7. The amplifier according to claim 6, wherein:

said p-channel transistor of said first amplifier path has a source terminal;

said p-channel transistor of said second amplifier path has a source terminal;

said n-channel transistor of said first amplifier path has a source terminal;

said n-channel transistor of said second amplifier path has a source terminal;

said drain terminal of said p-channel control transistor is connected to said source terminal of said p-channel transistor of said first amplifier path and to said source terminal of said p-channel transistor of said second amplifier path; and said drain terminal of said n-channel control transistor is connected to said source terminal of said n-channel transistor of said first amplifier path and to said source terminal of said n-channel transistor of said second amplifier path.

8. The amplifier according to claim 4, wherein: said first FET control transistor and said second FET control transistor are operated in a triode region.

9. The amplifier according to claim 1, wherein:

said p-channel transistor of said first amplifier path and said p-channel transistor of said second amplifier path are identically constructed; and said n-channel transistor of said first amplifier path and said n-channel transistor of said second amplifier path are identically constructed.

10. The amplifier according to claim 1, comprising: a capacitor coupled to said node.

11. The amplifier according to claim 1, wherein said first amplifier path and said second amplifier path are configured for amplifying high-frequency signals.

12. A differential, complementary amplifier, comprising:

a first complementary MOSFET amplifier path including a p-channel transistor and an n-channel transistor connected in series;

a second complementary MOSFET amplifier path including a p-channel transistor and an n-channel transistor connected in series;

a first load resistor and a second load resistor; and a node;

said second amplifier path being operated in an opposite direction relative to said first amplifier path;

said first amplifier path having an output;

said second amplifier path having an output;

said output of said first amplifier path and said output of said second amplifier path forming a differential output;

said first load resistor connecting said output of said first amplifier path to said node;

said second load resistor connecting said output of said second amplifier path to said node;

said first amplifier path and said second amplifier path having an operating point set by a voltage present at said node;

at least a first FET control transistor and a second FET control transistor for controlling a current supplied to said first amplifier path and to said second amplifier path;

a first current mirror circuit including a MOSFET transistor having an input connected to said node; and a second current mirror circuit including a MOSFET transistor having an input connected to said node;

said first control transistor having a source terminal;

said second control transistor having a source terminal;

said MOSFET transistor of said first current mirror circuit having an output connected to said source terminal of said first control transistor;

said MOSFET transistor of said second current mirror circuit having an output connected to said source terminal of said second control transistor;

said first current mirror circuit being assigned to said first control transistor; and said second current mirror circuit being assigned to said second control transistor.

13. The amplifier according to claim 12, wherein: said first control transistor and said second control transistor are operated in a pinch-off region.

14. The amplifier according to claim 12, wherein said first amplifier path and said second amplifier path are driven by half of an operating voltage.

15. The amplifier according to claim 12, wherein said first amplifier path and said second amplifier path have a bandwidth being variable by varying said first load resistor and said second load resistor.

16. The amplifier according to claim 12, wherein:

said p-channel transistor of said first amplifier path and said p-channel transistor of said second amplifier path are identically constructed; and said n-channel transistor of said first amplifier path and said n-channel transistor of said second amplifier path are identically constructed.

17. The amplifier according to claim 12, comprising: a capacitor coupled to said node.

18. A differential, complementary amplifier, comprising:

a first complementary MOSFET amplifier path including a p-channel transistor and an n-channel transistor connected in series;

a second complementary MOSFET amplifier path including a p-channel transistor and an n-channel transistor connected in series;

a first load resistor and a second load resistor; and a node;

said second amplifier path being operated in an opposite direction relative to said first amplifier path;

said first amplifier path having an output;

said second amplifier path having an output;

said output of said first amplifier path and said output of said second amplifier path forming a differential output;

said first load resistor connecting said output of said first amplifier path to said node;

said second load resistor connecting said output of said second amplifier path to said node;

said first amplifier path and said second amplifier path having an operating point set by a voltage present at said node; and a negative feedback device for said first amplifier path and for said second amplifier path.

19. The amplifier according to claim 18, wherein:

said first amplifier path has source terminals;

said second amplifier path has source terminals;

said negative feedback device includes a first resistor connected to one of said source terminals of said first amplifier path and to one of said source terminals of said second amplifier path; and said negative feedback device includes a second resistor connected to another one of said source terminals of said first amplifier path and to another one of said source terminals of said second amplifier path.

20. The amplifier according to claim 19, comprising:

a terminal for receiving an operating voltage;

a ground terminal;

two control transistors of identical size having gate terminals connected to said node and source terminals connected to said terminal for receiving the operating voltage, each one of said two control transistors having a drain terminal connected to a respective one of said first amplifier path and said second amplifier path; and two further control transistors of identical size having gate terminals connected to said node and source terminals connected to said ground terminal, each one of said two further control transistors having a drain terminal connected to a respective one of said first amplifier path and said second amplifier path;

one of said control transistors and one of said further control transistors associated with said first amplifier path;

another one of said control transistors and another one of said further control transistors associated with said second amplifier path;

said first amplifier path and said second amplifier path defining two paths;

at least one resistor connecting said first amplifier path to said second amplifier path at a location between said two control transistors and said two paths; and at least one further resistor connecting said first amplifier path to said second amplifier path at a location between said two further control transistors and said two paths.

21. The amplifier according to claim 20, comprising:

a capacitor connected in parallel with said first resistor of said feedback device; and a capacitor connected in parallel with said second resistor of said feedback device.

22. The amplifier according to claim 18, wherein said first amplifier path and said second amplifier path are driven by half of an operating voltage.

23. The amplifier according to claim 18, wherein said first amplifier path and said second amplifier path have a bandwidth being variable by varying said first load resistor and said second load resistor.

24. The amplifier according to claim 18, wherein:

said p-channel transistor of said first amplifier path and said p-channel transistor of said second amplifier path are identically constructed; and said n-channel transistor of said first amplifier path and said n-channel transistor of said second amplifier path are identically constructed.

25. The amplifier according to claim 18, comprising: a capacitor coupled to said node.

* * * * *